(12) United States Patent
Lee

(10) Patent No.: US 7,687,344 B2
(45) Date of Patent: Mar. 30, 2010

(54) METHOD FOR FABRICATING CAPACITOR IN SEMICONDUCTOR DEVICE

(75) Inventor: Sung-Kwon Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 703 days.

(21) Appl. No.: 11/320,235

(22) Filed: Dec. 27, 2005

(65) Prior Publication Data
US 2006/0199329 A1 Sep. 7, 2006

(30) Foreign Application Priority Data
Mar. 3, 2005 (KR) .................... 10-2005-0017752

(51) Int. Cl.
*H01L 21/8242* (2006.01)
(52) U.S. Cl. ............... 438/254; 438/397; 257/E21.019
(58) Field of Classification Search ............... 438/253, 438/255, 254, 396, 397; 257/E21.011, E21.019
See application file for complete search history.

(56) References Cited

U.S. PATENT DOCUMENTS

| | | | | |
|---|---|---|---|---|
| 6,136,643 | A * | 10/2000 | Jeng et al. .................... | 438/253 |
| 6,174,781 | B1 * | 1/2001 | Dai et al. ...................... | 438/396 |
| 6,271,084 | B1 * | 8/2001 | Tu et al. ....................... | 438/253 |
| 6,291,846 | B1 * | 9/2001 | Ema et al. .................... | 257/296 |
| 6,313,005 | B1 * | 11/2001 | Kishida et al. ............... | 438/398 |
| 6,898,851 | B2 * | 5/2005 | Nishioka et al. ............... | 29/852 |
| 6,902,998 | B2 | 6/2005 | Lee et al. | |
| 7,018,893 | B1 * | 3/2006 | Kundalgurki ................ | 438/254 |
| 7,291,531 | B2 * | 11/2007 | Cho et al. .................... | 438/253 |
| 7,435,677 | B2 * | 10/2008 | Choi ............................ | 438/637 |
| 7,544,563 | B2 * | 6/2009 | Manning ..................... | 438/253 |
| 2004/0018679 | A1 * | 1/2004 | Yu et al. ....................... | 438/253 |
| 2004/0077143 | A1 * | 4/2004 | Lee et al. ...................... | 438/253 |
| 2005/0085072 | A1 * | 4/2005 | Kim et al. ..................... | 438/684 |
| 2005/0112819 | A1 * | 5/2005 | Kim et al. ..................... | 438/239 |
| 2005/0233572 | A1 * | 10/2005 | Su et al. ....................... | 438/618 |
| 2006/0134909 | A1 * | 6/2006 | Nagase et al. ............... | 438/637 |

FOREIGN PATENT DOCUMENTS

| KR | 10-0338111 | 7/2001 |
|---|---|---|
| KR | 10-2004-0001960 | 1/2004 |
| KR | 10-2004-0008587 | 1/2004 |
| KR | 1020040078831 A | 9/2004 |
| KR | 10-2004-0091983 | 11/2004 |
| KR | 10-2005-0001183 | 1/2005 |

* cited by examiner

*Primary Examiner*—W. David Coleman
*Assistant Examiner*—Latanya Crawford
(74) *Attorney, Agent, or Firm*—Blakely, Sokoloff, Taylor & Zafman

(57) ABSTRACT

A first insulation layer is formed on a substrate structure including an inter-layer insulation layer and a storage node contact plug. The first insulation layer is etched to form a first opening exposing a portion of the storage node contact plug. The first opening is filled with an organic polymer layer. An etch stop layer and a second insulation layer are formed on the organic polymer layer and the first insulation layer. A photoresist pattern is formed on the second insulation layer. The second insulation layer and the etch stop layer are etched to form a second opening exposing a portion of the organic polymer layer. The photoresist pattern and the organic polymer layer are removed, thereby extending a portion of the second opening. A storage node is formed over the extended second opening and the second insulation layer.

12 Claims, 5 Drawing Sheets

METHOD FOR FABRICATING CAPACITOR IN SEMICONDUCTOR DEVICE

FIELD OF THE INVENTION

An embodiment of the invention relates to a method for fabricating a semiconductor device; and, more particularly, to a method for forming a capacitor in a semiconductor device.

DESCRIPTION OF RELATED ARTS

As semiconductor devices have been highly integrated, the minimum critical dimension which determines the size of a chip has rapidly decreased. Thus, a margin or an overlay margin for preventing a pattern bridge among layers during semiconductor device fabrication has also been reduced. For example, for a dynamic random access memory (DRAM) with a minimum critical dimension of 90 nm, only a misalignment margin of approximately 30 nm is secured in a critical layer. Therefore, there is a demand for securing a process margin.

One of the areas where the securing of the process margin is needed is a fabrication process for storage nodes of capacitors. Currently, securing the process margin required during the formation of the storage nodes is attracting attention as the minimum critical dimension of the semiconductor device is rapidly decreasing. Thus, numerous attempts are being made to secure larger process margins.

According to Published U.S. patent application Ser. No. 10/404,401 issued to S. H. Lee et al., entitled "Semiconductor Device Having Storage Node and Method for Manufacturing" as shown in FIG. 1, spacing distances among storage nodes can be secured relatively safely by arranging the storage nodes in zigzag array with respect to bit lines and gate lines using a zigzag type electrode mask. Thus, the pattern bridges between storage nodes can be effectively prevented. The pattern bridges are generated as semiconductor devices have been highly integrated and the minimum critical dimension has rapidly decreased.

However, the aforementioned method requires increasing the height of all of the insulation layers to form the storage nodes for securing a certain level of capacitor capacitance, and this fact may further require securing a bottom region during an insulation layer etching process to form the storage nodes.

SUMMARY OF THE INVENTION

An embodiment of the invention is a method for fabricating a capacitor in a semiconductor device capable of reducing an increase of the total height of the insulation layers required to secure capacitance of the capacitor, and improving a capacitor characteristic.

In accordance with an aspect of the present invention, there is provided a method for fabricating a capacitor in a semiconductor device, including: forming a first insulation layer on a substrate structure that has an inter-layer insulation layer and a storage node contact plug; etching the first insulation layer to form a first opening exposing a predetermined portion of the storage node contact plug; filling the first opening with an organic polymer layer; sequentially forming an etch stop layer and a second insulation layer on the organic polymer layer and the first insulation layer; forming a photoresist pattern on the second insulation layer using a mask; etching a predetermined portion of the second insulation layer and the etch stop layer to form a second opening exposing a predetermined portion of the organic polymer layer; simultaneously removing the photoresist pattern and the organic polymer layer, thereby extending a portion of the second opening; and forming a storage node over the extended second opening and the second insulation layer.

BRIEF DESCRIPTION OF THE DRAWINGS

The above features of the present invention will become better understood with respect to the following description of the specific embodiments given in conjunction with the accompanying drawings, in which.

DETAILED DESCRIPTION OF THE INVENTION

A method for fabricating a capacitor in a semiconductor device in accordance with certain embodiments of the present invention will be described in detail with reference to the accompanying drawings.

FIGS. 2A to 2E are cross-sectional views illustrating a method for fabricating a capacitor in a semiconductor device in accordance with a specific embodiment of the invention. The method for fabricating the capacitor is briefly described hereinafter.

Figure 1:
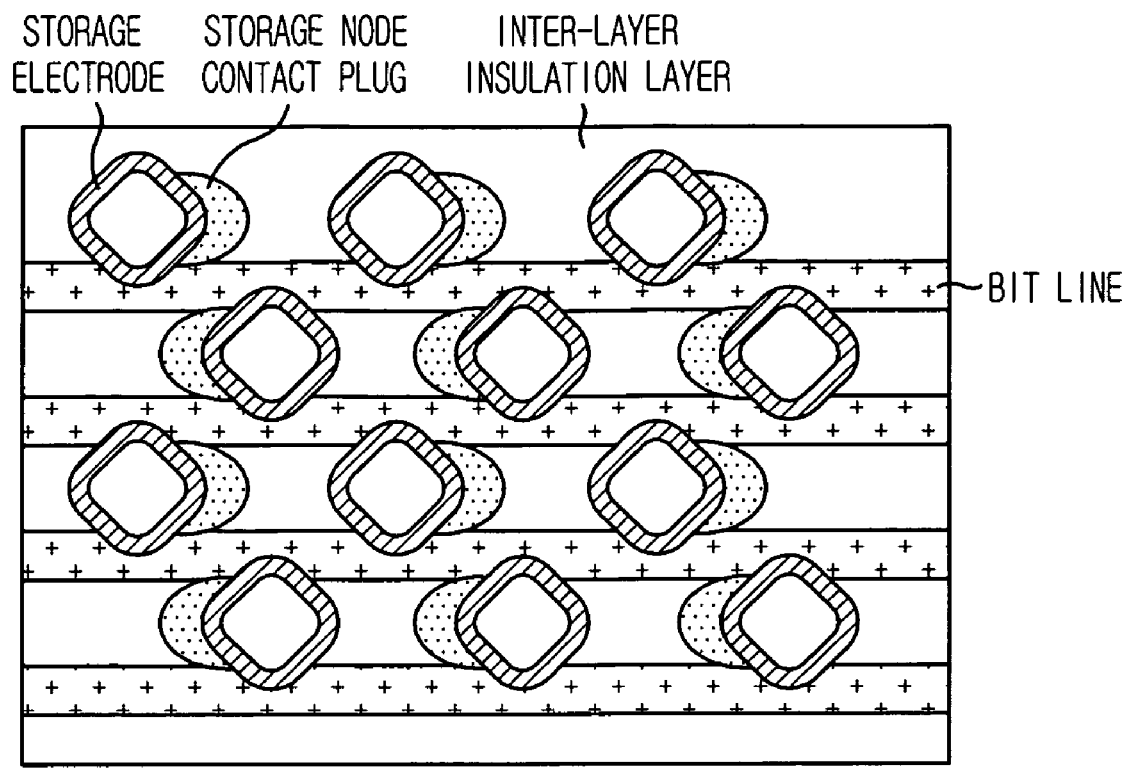
FIG. 1 is a top view illustrating a layout of conventional storage nodes formed on a substrate structure.
Figure 2A:
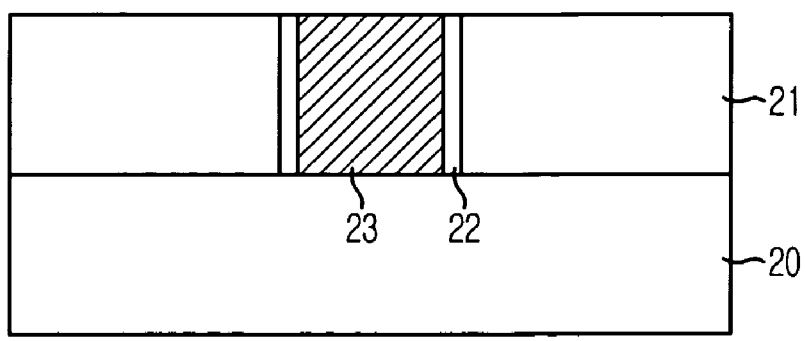
FIGS. 2A to 2E are cross-sectional views illustrating a method for fabricating a capacitor in a semiconductor device in accordance with a specific embodiment of the present invention.

As shown in FIG. 2A, an inter-layer insulation layer 21 with a predetermined thickness is formed on a substrate 20, wherein certain lower structures including transistors and bit lines, although not illustrated, are already formed on the substrate 20. Then, a predetermined portion of the first inter-layer insulation layer 21 is etched by utilizing a mask to form a storage node contact hole (not shown) exposing a predetermined portion of the substrate 20. Herein, the portion of the substrate 20 exposed by the storage node contact hole may be a source/drain conjugation region, and the inter-layer insulation layer 21 includes one selected from the group consisting of a high density plasma (HDP) layer, a tetraethyl orthosilicate (TEOS) layer, a boro-phospho-silicate glass (BPSG) layer, a phosphosilicate glass (PSG) layer, a plasma enhanced chemical vapor deposition (PECVD) layer, a silicon oxynitride (SiON) layer, and a combination thereof.

Subsequently, a nitride layer is formed over the above resulting substrate structure including the storage node contact hole, and then a front side etching process is performed on the above resulting substrate structure to remove the nitride layer formed on the inter-layer insulation layer 21 excluding portions formed over the storage node contact hole. As a result, the remaining portions of the nitride layer become spacers 22 being formed on lateral walls of the storage node contact hole.

Furthermore, a storage node contact plug 23 is formed, completely filling the storage node contact hole. Herein, the storage node contact plug 23 is formed by employing polysilicon, tungsten (W), tungsten nitride (WN), titanium nitride (TiN) or titanium tungsten (TiW).

Figure 2B:
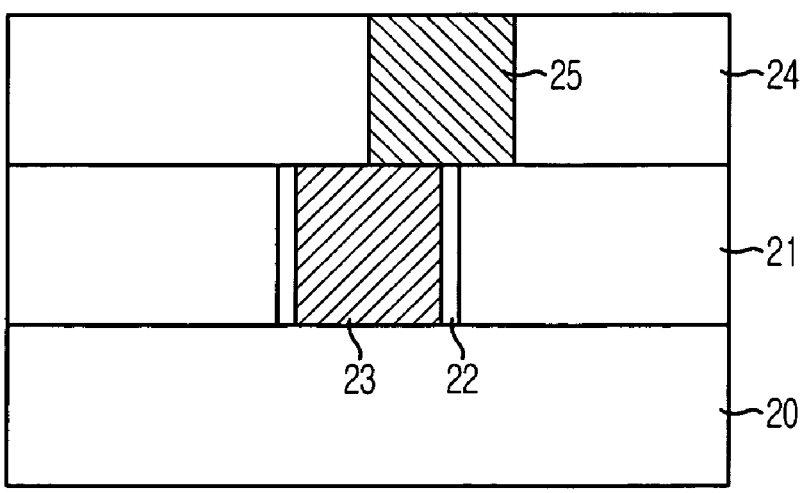

As shown in FIG. 2B, an insulation layer 24 is formed on the above resulting substrate structure. The insulation layer 24 includes an oxide material. Then, although not illustrated, the insulation layer 24 is etched to form a first opening exposing a predetermined portion of the storage node contact plug 23. Herein, the first opening is formed as a contact hole for securing a space.

An organic polymer layer 25 is formed over the above resulting substrate structure. Then, the organic polymer layer 25 is planarized by either an etch-back process or a chemical mechanical polishing (CMP) process. The planarization continues until the organic polymer layer 25 fills the first opening. Herein, amorphous carbon may be used to fill the first opening instead of the organic polymer layer 25.

Figure 2C:
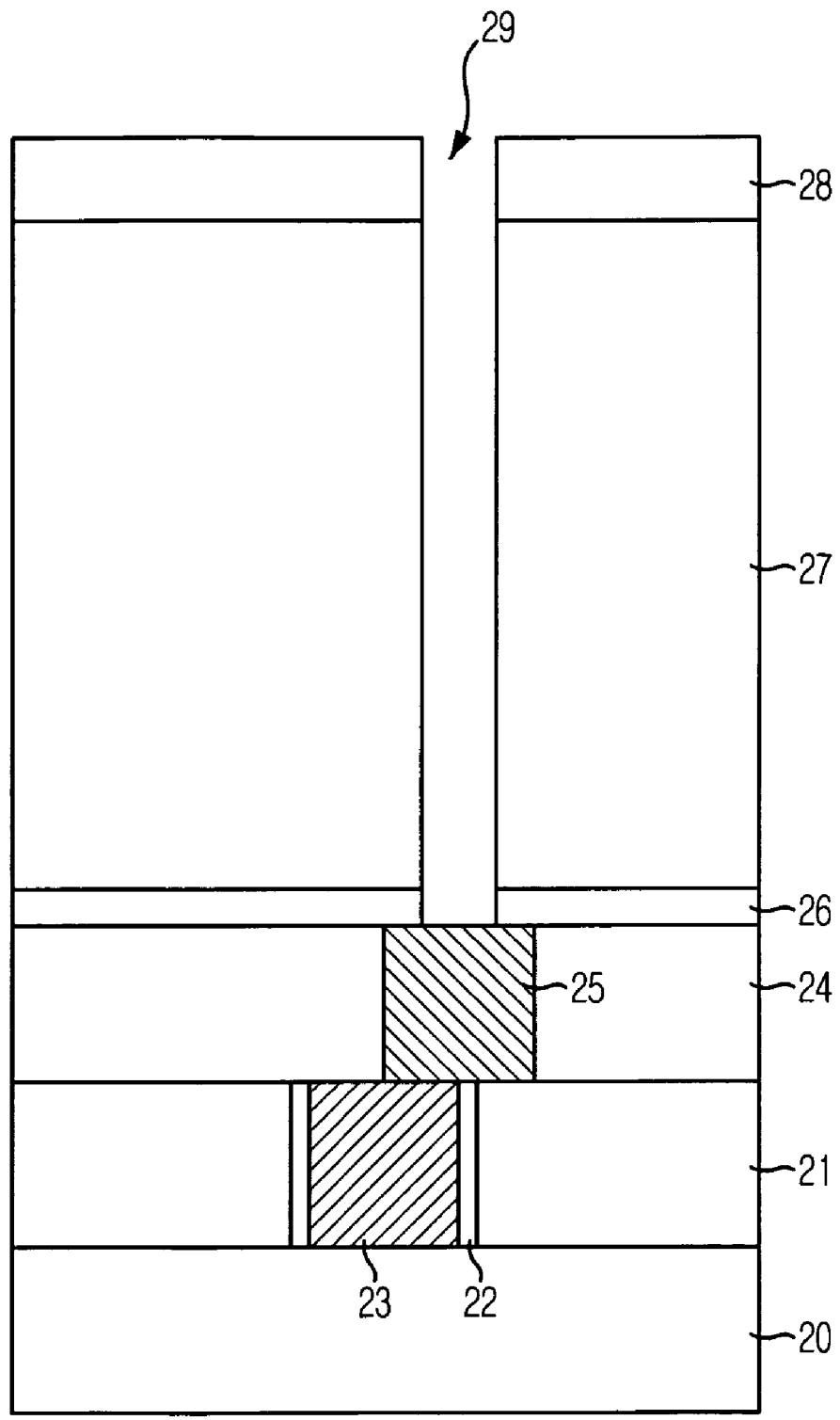

Referring to FIG. 2C, an etch stop layer 26 is formed over the insulation layer 24 and the organic polymer layer 25, and then an oxide layer 27 for use in a storage node is formed on the etch stop layer 26. Herein, the oxide layer 27 can be formed in a single layer or in multiple layers. The etch stop layer 26 includes one selected from the group consisting of a nitride material, SiON, tritantalum tetraoxide ($Ta_3O_4$), aluminum oxide ($Al_2O_3$), atomic layer deposition (ALD) nitride, and silicon boron nitride (SiBN), and has an etch selectivity ratio with respect to the oxide layer 27, thereby working as a barrier that effectively stops etching during the formation of the storage node.

In accordance with another specific embodiment of the present invention, after forming the oxide layer 27, a hard mask layer may be formed on the oxide layer 27. Herein, the hard mask layer includes one selected from the group consisting of polysilicon, SiON, W, amorphous carbon, black diamond, siloxane, silicon monoxide (SiO) polymer including silsesquioxane-type silicon (Si) element, and a combination thereof.

Subsequently, a photoresist pattern 28 is formed on a predetermined portion of the oxide layer 27 where the storage node is to be formed by utilizing a mask arranged in zigzag pattern. Herein, as an alternative to the above zigzag arrangement, the mask can be arranged in other types. Next, the oxide layer 27 is etched, and the etching process is temporarily stopped on top of the etch stop layer 26. Then, the etch stop layer 26 is etched to form a second opening 29 exposing a predetermined portion of the organic polymer layer 25. Herein, by using the aforementioned mask, storage nodes to be formed later can be arranged in a zigzag array, and thus the spacing distances between the adjacent storage nodes can be safely maintained, so that an incidence of a bridge generation among the storage nodes can be prevented.

Figure 2D:
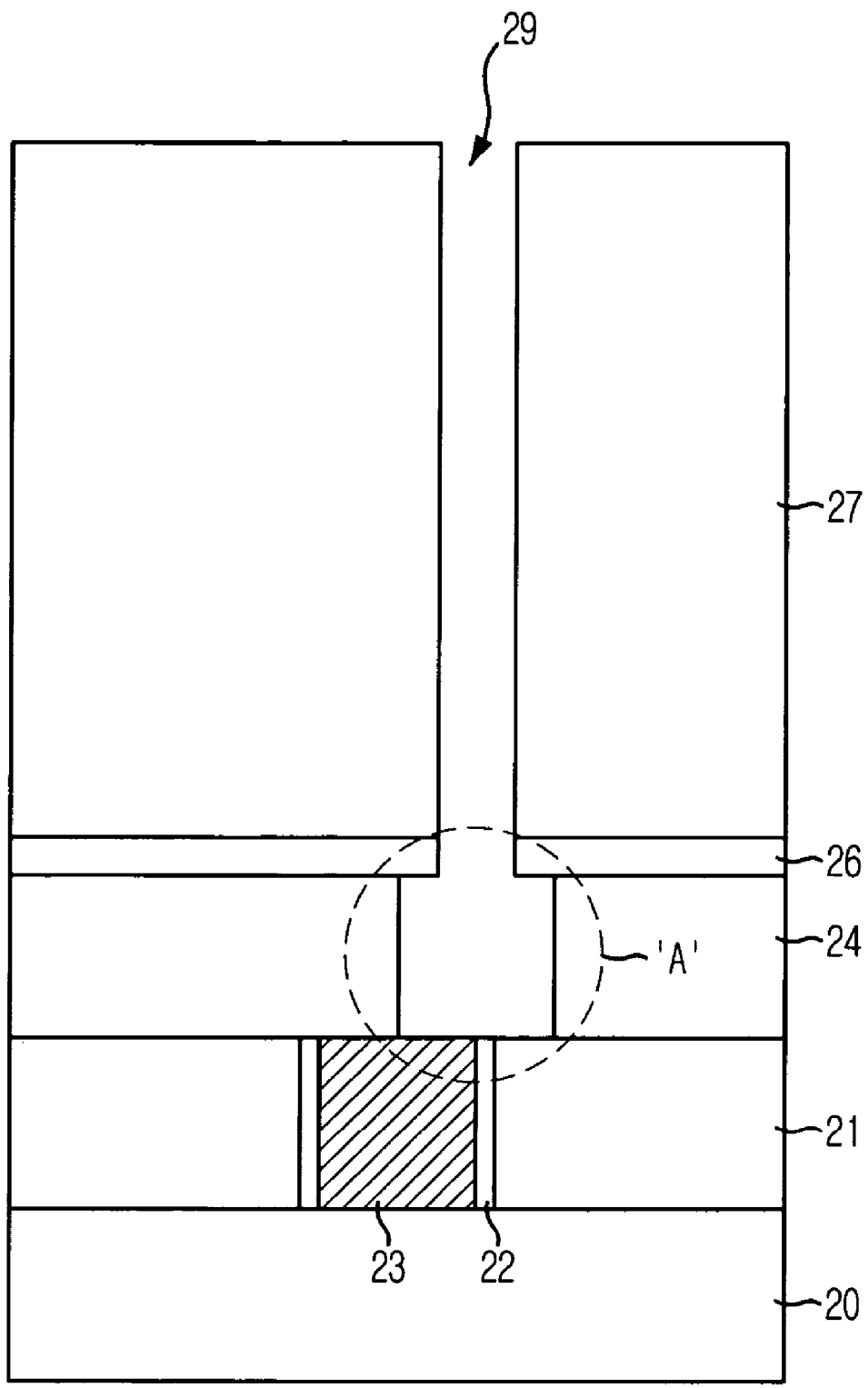

Referring to FIG. 2D, while the photoresist pattern 28 is removed, the organic polymer layer 25 is removed and cleaned to extend the lower portion of the second opening 29 as illustrated with a reference denotation 'A' in FIG. 2D.

Figure 2E:
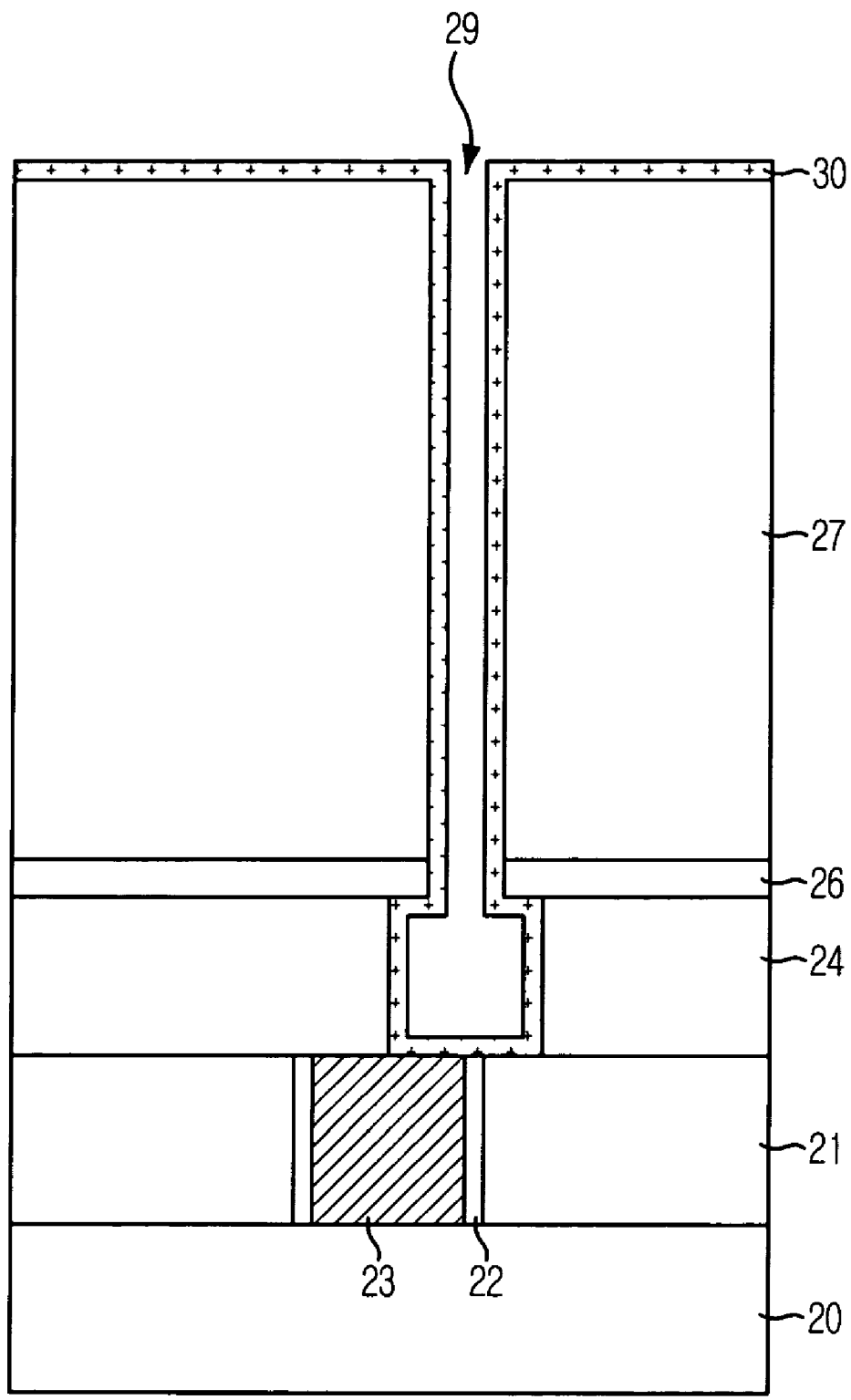

Referring to FIG. 2E, the aforementioned storage node 30 is formed over the oxide layer 27 and the extended second opening 29. Herein, because of the extended lower portion 'A', a contact margin between the storage node 30 and the storage node contact plug 23 can be secured, and the surface region of the storage node 30 can be increased as much as the extended lower portion 'A'. Thus, capacitance of the capacitor can be increased.

Next, the storage node 30 is isolated through an etch-back process or a CMP process, and then follow-up processes are performed to complete the capacitor formation.

In accordance with an embodiment of the present invention, by forming the opening for securing a space during the formation of the storage node of the capacitor, the contact margin between the storage node and the storage node contact plug can be secured, and the storage node is extended within the opening. As a result, the increase in height of the insulation layers for forming the storage node can be reduced, and the capacitance of the capacitor can be secured. Also, by forming the oxide-based insulation layer between the etch stop layer and the spacers, which are formed of nitride, the spacers can be protected while the etch stop layer based on the same material for the spacers (i.e., nitride) is etched. Thus, during the follow-up capacitor processes including the operations of forming the storage node and forming a dielectric film and a plate electrode, an increase in capacitor leakage current often caused by a step coverage defect can be prevented, and device reliability and yield rate of production can be increased.

The present application contains subject matter related to the Korean patent application No. KR 2005-0017752, filed in the Korean Patent Office on Mar. 3, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method of fabricating a capacitor in a semiconductor device, comprising:

forming a storage node contact plug in a portion of an inter-layer insulation layer over a substrate;

forming a first insulation layer over the inter-layer insulation layer and the storage node contact plug;

etching the first insulation layer to form a first opening exposing a portion of the storage node contact plug and the inter-layer insulation layer having the storage node contact plug formed therein;

filling the first opening with an organic polymer layer including contacting a bottom of the organic polymer layer with the storage node contact plug and the inter-layer insulation layer having the storage node contact plug formed therein;

sequentially forming an etch stop layer and a second insulation layer over the organic polymer layer and the first insulation layer;

forming a photoresist pattern on the second insulation layer using a mask;

etching a portion of the second insulation layer and the etch stop layer to form a second opening exposing a portion of the organic polymer layer;

simultaneously removing the photoresist pattern and the organic polymer including extending a portion of the second opening; and forming a storage node over the extended second opening and the second insulation layer.

2. The method of claim 1, wherein filling the first opening comprises:

forming the organic polymer layer over the first opening and the first insulation layer; and planarizing the organic polymer layer by one of an etch-back process and a chemical mechanical polishing (CMP) process.

3. The method of claim 1, further comprising forming the storage node contact plug using at least one selected from the group consisting of polysilicon, tungsten (W), tungsten nitride (WN), titanium nitride (TiN), and titanium tungsten (TiW).

4. The method of claim 1, wherein the organic polymer layer includes an amorphous carbon layer.

5. The method of claim 1, further comprising forming the inter-layer insulation layer by including one selected from the group consisting of a high density plasma (HDP) layer, a tetraethyl orthosilicate (TEOS) layer, a boro-phospho-silicate glass (BPSG) layer, a phosphosilicate glass (PSG) layer, a plasma enhanced chemical vapor deposition (PECVD) layer, a silicon oxynitride (SiON) layer, and a combination thereof.

6. The method of claim 1, wherein said forming the second insulation layer comprises forming one of a single layer and multiple layers.

7. The method of claim 1, after the forming of the second insulation layer, further comprising forming a hard mask layer on the second insulation layer.

8. The method of claim 1, wherein said forming the first insulation layer and the second insulation layer comprises including an oxide material.

9. The method of claim 1, wherein said forming the etch stop layer comprises including at least one selected from the group consisting of a nitride material, SiON, tritantalum tetraoxide ($Ta_3O_4$), aluminum oxide ($Al_2O_3$), atomic layer deposition (ALD) nitride, and silicon boron nitride (SiBN).

10. The method of claim 1, wherein said forming the photoresist pattern on the second insulation layer comprises using a mask that is arranged in zigzag pattern.

11. The method of claim 2, wherein the organic polymer layer includes an amorphous carbon layer.

12. The method of claim 7, wherein said forming the hard mask layer comprises including one selected from the group consisting of polysilicon, SiON, W, amorphous carbon, black diamond, siloxane, silicon monoxide (SiO) polymer including silsesquioxane-type silicon (Si) element, and a combination thereof.

* * * * *